(12) United States Patent
Takematsu

(10) Patent No.: US 12,438,508 B2
(45) Date of Patent: Oct. 7, 2025

(54) RADIO-FREQUENCY MODULE

(71) Applicant: Murata Manufacturing Co., Ltd., Kyoto (JP)

(72) Inventor: Yuji Takematsu, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 428 days.

(21) Appl. No.: 18/296,669

(22) Filed: Apr. 6, 2023

(65) Prior Publication Data

US 2023/0261618 A1    Aug. 17, 2023

Related U.S. Application Data

(63) Continuation of application No. PCT/JP2021/037686, filed on Oct. 12, 2021.

(30) Foreign Application Priority Data

Nov. 25, 2020 (JP) .................. 2020-195153

(51) Int. Cl.
 *H03F 3/195* (2006.01)
 *H03F 1/56* (2006.01)

(52) U.S. Cl.
 CPC .............. *H03F 3/195* (2013.01); *H03F 1/565* (2013.01); *H03F 2200/222* (2013.01); *H03F 2200/387* (2013.01); *H03F 2200/451* (2013.01)

(58) Field of Classification Search
 CPC ....................................................... H03F 3/195
 USPC ........................................................ 330/307
 See application file for complete search history.

(56) References Cited

U.S. PATENT DOCUMENTS

| | | |
|---|---|---|
| 5,717,249 A | 2/1998 | Yoshikawa et al. |
| 2002/0074669 A1 | 6/2002 | Watanabe et al. |
| 2003/0169575 A1 | 9/2003 | Kuta et al. |
| 2007/0176298 A1 | 8/2007 | Osone et al. |
| 2020/0203291 A1 | 6/2020 | Uejima |
| 2021/0226652 A1 | 7/2021 | Matsumoto et al. |

FOREIGN PATENT DOCUMENTS

| | | |
|---|---|---|
| JP | H08-335836 A | 12/1996 |
| JP | 2000-223659 A | 8/2000 |
| JP | 2002-184933 A | 6/2002 |
| JP | 2002-359327 A | 12/2002 |
| JP | 2007-188916 A | 7/2007 |
| JP | 2020-102693 A | 7/2020 |
| WO | 2020/090557 A1 | 5/2020 |

OTHER PUBLICATIONS

International Search Report for PCT/JP2021/037686 dated Jan. 11, 2022.

*Primary Examiner* — Henry Choe
(74) *Attorney, Agent, or Firm* — McDonald Hopkins LLC

(57) ABSTRACT

A radio-frequency module includes a first base including electrical circuits, a second base including a power amplifier circuit, a matching component that is arranged outside the first base and the second base and that includes a first matching element connected to the power amplifier circuit, and a module substrate having a main surface on which the first base, the second base, and the matching component are arranged. The first base is joined to the main surface via an electrode. The second base is arranged between the module substrate and the first base in a sectional view and is joined to the main surface via an electrode. At least part of the first base is overlapped with at least part of the second base in a plan view.

20 Claims, 9 Drawing Sheets

RADIO-FREQUENCY MODULE

CROSS REFERENCE TO RELATED APPLICATION

This is a continuation of International Application No. PCT/JP2021/037686 filed on Oct. 12, 2021 which claims priority from Japanese Patent Application No. 2020-195153 filed on Nov. 25, 2020. The contents of these applications are incorporated herein by reference in their entireties.

BACKGROUND OF THE DISCLOSURE

Field of the Disclosure

The present disclosure relates to a radio-frequency module.

Description of the Related Art

In mobile communication devices, such as mobile phones, the arrangement configuration of circuit elements composing radio-frequency front-end circuits is increasingly complicated particularly with the progress of multiband communication.

In a radio-frequency module in Patent Document 1, a variable matching circuit including at least one matching element is used to adjust the output impedance of a power amplifier.

Patent Document 1: Japanese Unexamined Patent Application Publication No. 2020-102693

BRIEF SUMMARY OF THE DISCLOSURE

However, in the technique in the related art described above, integrating the matching element and the power amplifier into one component to reduce the size of the radio-frequency module may degrade the electrical characteristics (for example, the Q value) of the matching element to degrade the electrical characteristics (for example, a noise factor (NF)) of the radio-frequency module. In addition, the heat dissipation effect of the power amplifier may be worsened.

In order to resolve the above problems, the present disclosure provides a radio-frequency module capable of reducing the size while suppressing the degradation of the electrical characteristics of the matching element and the reduction of the heat dissipation effect of the power amplifier circuit.

A radio-frequency module according to one aspect of the present disclosure includes a first base at least part of which is made of a first semiconductor material and which includes electrical circuits; a second base at least part of which is made of a second semiconductor material having thermal conductivity lower than that of the first semiconductor material and which includes a power amplifier circuit; a first matching component that is arranged outside the first base and the second base and that includes a first matching element connected to the power amplifier circuit; and a module substrate having a main surface on which the first base, the second base, and the first matching component are arranged. The first matching element includes at least one of an inductor and a capacitor. The first base is joined to the main surface via a first electrode. The second base is arranged between the module substrate and the first base in a sectional view and is joined to the main surface via a second electrode. At least part of the first base is overlapped with at least part of the second base in a plan view.

A radio-frequency module according to one aspect of the present disclosure includes a first base at least part of which is made of silicon or gallium nitride and which includes electrical circuits; a second base at least part of which is made of gallium arsenide or silicon-germanium and which includes a power amplifier circuit; a first matching component that is arranged outside the first base and the second base and that includes at least one of an inductor and a capacitor connected to the power amplifier circuit; and a module substrate having a main surface on which the first base, the second base, and the first matching component are arranged. The first base is joined to the main surface via a first electrode. The second base is arranged between the module substrate and the first base in a sectional view and is joined to the main surface via a second electrode. At least part of the first base is overlapped with at least part of the second base in a plan view.

According to the radio-frequency module according to one aspect of the present disclosure, it is possible to reduce the size while suppressing the degradation of the electrical characteristics of the matching element and the reduction of the heat dissipation effect of the power amplifier circuit.

DETAILED DESCRIPTION OF THE DISCLOSURE

Figure 1:
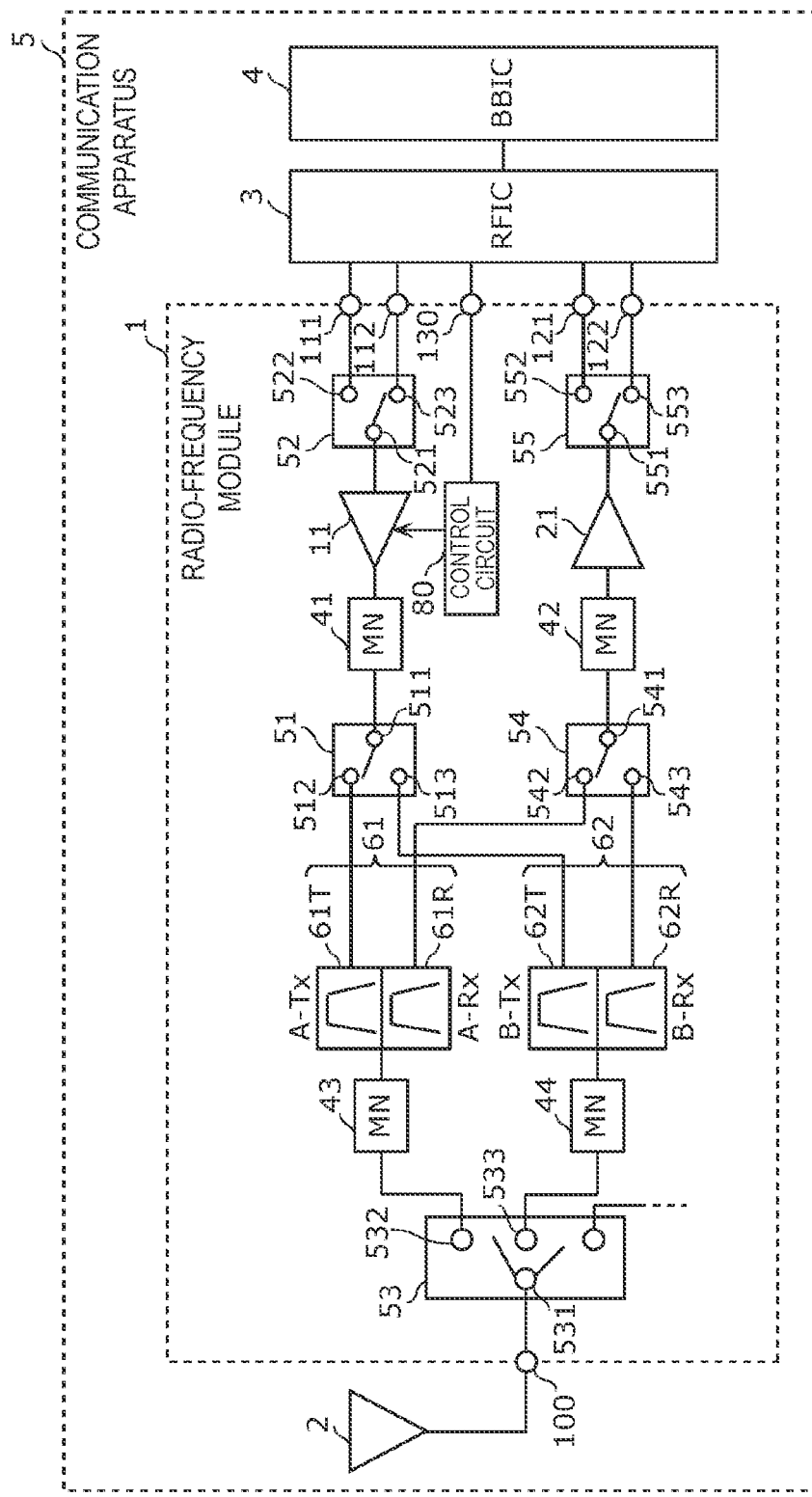
FIG. 1 is a diagram illustrating the circuit configurations of a radio-frequency module and a communication apparatus according to a first embodiment.

Embodiments of the present disclosure will herein be described in detail with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure.

The respective drawings are schematic diagrams appropriately subjected to emphasis, omission, or adjustment of ratios in order to describe the present disclosure. The respective drawings are not necessarily strictly illustrated and may be different from the actual shapes, positional relationship, and ratios. The same reference numerals and letters are used in the respective drawings to identify substantially the same components and a duplicated description of such components may be omitted or simplified.

In the respective drawings described below, the x axis and the y axis are axes that are orthogonal to each other on a plane parallel to main surfaces of a module substrate. Specifically, when the module substrate has a rectangular shape in a plan view, the x axis is parallel to a first side of the module substrate and the y axis is parallel to a second side orthogonal to the first side of the module substrate. The z axis is an axis vertical to the main surfaces of the module substrate. The positive direction of the z axis indicates the upper direction and the negative direction thereof indicates the lower direction.

In the circuit configuration of the present disclosure, "connected" includes not only direct connection with a connection terminal and/or a wiring conductor but also electrical connection via another circuit element. "Connected between A and B" means connection to both A and B between A and B.

In the arrangement of components of the present disclosure, a "plan view" means viewing an object that is orthographically projected on the x-y plane from the positive side of the z axis. "Overlapping of A with B in a plan view" means overlapping of the area of A orthographically projected on the x-y plane with the area of B orthographically projected on the x-y plane. "Arrangement of A between B and C in a plan view" means passing of at least one line segment, among multiple line segments connecting an arbitrary point in the area of B projected on the x-y plane to an arbitrary point in the area of C projected on the x-y plane, through the area of A projected on the x-y plane. "Sectional view" means viewing something with being cut along a cross section vertical to the x-y plane. "Arrangement of A between B and C in a sectional view" means passing of at least one line segment, among multiple line segments connecting an arbitrary point in the area of B to an arbitrary point in the area of C, through the area of A on a cross section vertical to the x-y plane. The terms, such as parallel and vertical, indicating the relationship between elements; the terms, such as rectangles, indicating the shapes of the elements; and numerical ranges do not represent only strict meanings but mean the inclusion of substantially the same ranges, for example, the differences on the order of a few percent.

"Arrangement of a component on a substrate" includes arrangement of the component above the substrate without being in contact with the substrate (for example, lamination of the component on another component arranged on the substrate) and embedding of part of the component or the entire component in the substrate, in addition to arrangement of the component on the substrate with being in contact with the substrate. In addition, "arrangement of a component on a main surface of a substrate" includes arrangement of the component above the main surface without being in contact with the main surface and embedding of part of the component in the substrate from the main surface side, in addition to arrangement of the component on the main surface with being in contact with the main surface of the substrate. "Arrangement of A outside B" means no-inclusion of A inside B. Accordingly, contact of A with the surface of B is included in the "arrangement of A outside B".

In the material configuration of the present disclosure, "an object A is made of a material B" means that the major component of A is B. Here, the major component means a component having the highest ratio of weight, among multiple components contained in the object.

First Embodiment

[1.1 Circuit Configurations of Radio-Frequency Module 1 and Communication Apparatus 5]

The circuit configurations of a radio-frequency module 1 and a communication apparatus 5 including the radio-frequency module 1 according to the present embodiment will be described with reference to FIG. 1. FIG. 1 is a diagram illustrating the circuit configurations of the radio-frequency module 1 and the communication apparatus 5 according to a first embodiment.

[1.1.1 Circuit Configuration of Communication Apparatus 5]

As illustrated in FIG. 1, the communication apparatus 5 according to the present embodiment includes the radio-frequency module 1, an antenna 2, a radio-frequency integrated circuit (RFIC) 3, and a baseband integrated circuit (BBIC) 4.

The radio-frequency module 1 transmits a radio-frequency signal between the antenna 2 and the RFIC 3. The internal configuration of the radio-frequency module 1 will be described below.

The antenna 2 is connected to an antenna connection terminal 100 of the radio-frequency module 1. A radio-frequency signal is externally received through the antenna 2 and is supplied to the radio-frequency module 1.

The RFIC 3 is an example of a signal processing circuit that processes the radio-frequency signal. Specifically, the RFIC 3 performs signal processing, such as down-conversion, to a radio-frequency reception signal inputted through a reception path of the radio-frequency module 1 and supplies a reception signal resulting from the signal processing to the BBIC 4. In addition, the RFIC 3 includes a control unit that controls switch circuits, amplifier circuits, and so on in the radio-frequency module 1. Part or all of the function of the RFIC 3 serving as the control unit may be provided outside the RFIC 3. For example, part or all of the function of the RFIC 3 serving as the control unit may be provided in the BBIC 4 or the radio-frequency module 1.

The BBIC 4 is a baseband signal processing circuit that performs signal processing using an intermediate frequency band lower than the frequency of the radio-frequency signal transmitted by the radio-frequency module 1. For example, an image signal for image display and/or an audio signal for talking with a speaker is used as the signal processed in the BBIC 4.

In the communication apparatus 5 according to the present embodiment, the antenna 2 and the BBIC 4 are not essential components.

[1.1.2 Circuit Configuration of Radio-Frequency Module 1]

Next, the circuit configuration of the radio-frequency module 1 will be described. As illustrated in FIG. 1, the radio-frequency module 1 includes a power amplifier circuit 11, a low noise amplifier circuit 21, impedance matching circuits (MNs) 41 to 44, switch circuits 51 to 55, duplexer circuits 61 and 62, a control circuit 80, the antenna connection terminal 100, radio-frequency input terminals 111 and 112, radio-frequency output terminals 121 and 122, and a control terminal 130.

The antenna connection terminal 100 is connected to the antenna 2 in the outside of the radio-frequency module 1.

Each of the radio-frequency input terminals 111 and 112 is an input terminal for receiving a radio-frequency transmission signal from the outside of the radio-frequency module 1. In the present embodiment, the radio-frequency input terminals 111 and 112 are connected to the RFIC 3 in the outside of the radio-frequency module 1.

Each of the radio-frequency output terminals 121 and 122 is an output terminal for supplying the radio-frequency reception signal to the outside of the radio-frequency module 1. In the present embodiment, the radio-frequency output terminals 121 and 122 are connected to the RFIC 3 in the outside of the radio-frequency module 1.

The control terminal 130 is a terminal used for transmitting a control signal. In other words, the control terminal 130 is a terminal for receiving the control signal from the outside of the radio-frequency module 1 and/or a terminal for supplying the control signal to the outside of the radio-frequency module 1. The control signal is a signal concerning the control of electronic components included in the radio-frequency module 1. Specifically, the control signal is a digital signal used for controlling the power amplifier circuit 11.

The power amplifier circuit 11 is an example of an amplifier circuit. The power amplifier circuit 11 is capable of amplifying transmission signals in bands A and B. An input end of the power amplifier circuit 11 is connected to the radio-frequency input terminals 111 and 112 via the switch circuit 52. An output end of the power amplifier circuit 11 is connected to transmission filter circuits 61T and 62T via the impedance matching circuit 41 and the switch circuit 51. The configuration of the power amplifier circuit 11 is not particularly limited and may be, for example, a multi-stage amplifier circuit or a differential amplifier circuit.

The low noise amplifier circuit 21 is capable of amplifying reception signals in the bands A and B. An input end of the low noise amplifier circuit 21 is connected to reception filter circuits 61R and 62R via the impedance matching circuit 42 and the switch circuit 54. An output end of the low noise amplifier circuit 21 is connected to the radio-frequency output terminals 121 and 122 via the switch circuit 55.

The impedance matching circuit 41 is connected to the output end of the power amplifier circuit 11 and is connected to input ends of the transmission filter circuits 61T and 62T via the switch circuit 51. The impedance matching circuit 41 includes at least one first matching element. The impedance matching circuit 41 is capable of performing the impedance matching between the output impedance of the power amplifier circuit 11 and the input impedance of the switch circuit 51.

The matching element is an element for radio-frequency impedance matching. Although an inductor and a capacitor are capable of being used as the matching element, the matching element is not limited to the inductor and the capacitor.

The impedance matching circuit 42 is connected to the input end of the low noise amplifier circuit 21 and is connected to output ends of the reception filter circuits 61R and 62R via the switch circuit 54. The impedance matching circuit 42 includes at least one matching element. The impedance matching circuit 42 is capable of performing the impedance matching between the output impedance of the switch circuit 54 and the input impedance of the low noise amplifier circuit 21.

The impedance matching circuit 43 is connected to an output end of the transmission filter circuit 61T and an input end of the reception filter circuit 61R and is connected to the antenna connection terminal 100 via the switch circuit 53. The impedance matching circuit 43 includes at least one matching element. The impedance matching circuit 43 is capable of performing the impedance matching between the switch circuit 53 and the duplexer circuit 61.

The impedance matching circuit 44 is connected to an output end of the transmission filter circuit 62T and an input end of the reception filter circuit 62R and is connected to the antenna connection terminal 100 via the switch circuit 53. The impedance matching circuit 44 includes at least one matching element. The impedance matching circuit 44 is capable of performing the impedance matching between the switch circuit 53 and the duplexer circuit 62.

The switch circuit 51 is an example of a first switch circuit. The switch circuit 51 is connected between the output end of the power amplifier circuit 11 and the input ends of the transmission filter circuits 61T and 62T. The switch circuit 51 has terminals 511 to 513. The terminal 511 is connected to the output end of the power amplifier circuit 11 via the impedance matching circuit 41. The terminal 512 is connected to the input end of the transmission filter circuit 61T. The terminal 513 is connected to the input end of the transmission filter circuit 62T.

In this connection configuration, the switch circuit 51 is capable of connecting the terminal 511 to either of the terminals 512 and 513, for example, based on the control signal from the RFIC 3. In other words, the switch circuit 51 is capable of switching the connection of the output end of the power amplifier circuit 11 between the transmission filter circuits 61T and 62T. The switch circuit 51 is composed of, for example, a single-pole double-throw (SPDT) switch and may be called a band selection switch.

The switch circuit 52 is an example of a second switch circuit. The switch circuit 52 is connected between the radio-frequency input terminals 111 and 112 and the input end of the power amplifier circuit 11. The switch circuit 52 has terminals 521 to 523. The terminal 521 is connected to the input end of the power amplifier circuit 11. The terminals 522 and 523 are connected to the radio-frequency input terminals 111 and 112, respectively.

In this connection configuration, the switch circuit 52 is capable of connecting the terminal 521 to either of the terminals 522 and 523, for example, based on the control signal from the RFIC 3. In other words, the switch circuit 52 is capable of switching the connection of the input end of the power amplifier circuit 11 between the radio-frequency input terminals 111 and 112. The switch circuit 52 is composed of, for example, an SPDT switch and may be called an in-switch.

The switch circuit 53 is an example of a third switch circuit. The switch circuit 53 is connected between the antenna connection terminal 100 and the duplexer circuits 61 and 62. The switch circuit 53 has terminals 531 to 533. The terminal 531 is connected to the antenna connection terminal 100. The terminal 532 is connected to the output end of the transmission filter circuit 61T and the input end of the reception filter circuit 61R via the impedance matching circuit 43. The terminal 533 is connected to the output end of the transmission filter circuit 62T and the input end of the reception filter circuit 62R via the impedance matching circuit 44.

In this connection configuration, the switch circuit 53 is capable of connecting the terminal 531 to either or both of the terminals 532 and 533, for example, based on the control signal from the RFIC 3. In other words, the switch circuit 53 is capable of switching between the connection and the non-connection between the antenna connection terminal 100 and the duplexer circuit 61 and switching between the connection and the non-connection between the antenna connection terminal 100 and the duplexer circuit 62. The switch circuit 53 is composed of a multi-connection switch and may be called an antenna switch.

The switch circuit 54 is connected between the input end of the low noise amplifier circuit 21 and the output ends of the reception filter circuits 61R and 62R. The switch circuit 54 has terminals 541 to 543. The terminal 541 is connected to the input end of the low noise amplifier circuit 21 via the impedance matching circuit 42. The terminal 542 is connected to the output end of the reception filter circuit 61R. The terminal 543 is connected to the output end of the reception filter circuit 62R.

In this connection configuration, the switch circuit 54 is capable of connecting the terminal 541 to either of the terminals 542 and 543, for example, based on the control signal from the RFIC 3. In other words, the switch circuit 54 is capable of switching the connection of the input end of the low noise amplifier circuit 21 between the reception filter circuits 61R and 62R. The switch circuit 54 is composed of, for example, an SPDT switch.

The switch circuit 55 is connected between the radio-frequency output terminals 121 and 122 and the output end of the low noise amplifier circuit 21. The switch circuit 55 has terminals 551 to 553. The terminal 551 is connected to the output end of the low noise amplifier circuit 21. The terminals 552 and 553 are connected to the radio-frequency output terminals 121 and 122, respectively.

In this connection configuration, the switch circuit 55 is capable of connecting the terminal 551 to either of the terminals 552 and 553, for example, based on the control signal from the RFIC 3. In other words, the switch circuit 55 is capable of switching the connection of the output end of the low noise amplifier circuit 21 between the radio-frequency output terminals 121 and 122. The switch circuit 55 is composed of, for example, an SPDT switch and may be called an out-switch.

The duplexer circuit 61 is capable of passing the radio-frequency signal in the band A. The duplexer circuit 61 transmits the transmission signal and the reception signal in the band A using a frequency division duplex (FDD) method. The duplexer circuit 61 includes the transmission filter circuit 61T and the reception filter circuit 61R.

The transmission filter circuit 61T (A-Tx) has a passband including an uplink operating band of the band A. Accordingly, the transmission filter circuit 61T is capable of passing the transmission signal in the band A. The transmission filter circuit 61T is connected between the power amplifier circuit 11 and the antenna connection terminal 100. Specifically, the input end of the transmission filter circuit 61T is connected to the output end of the power amplifier circuit 11 via the switch circuit 51 and the impedance matching circuit 41. In contrast, the output end of the transmission filter circuit 61T is connected to the antenna connection terminal 100 via the impedance matching circuit 43 and the switch circuit 53.

The reception filter circuit 61R (A-Rx) has a passband including a downlink operating band of the band A. Accordingly, the reception filter circuit 61R is capable of passing the reception signal in the band A. The reception filter circuit 61R is connected between the antenna connection terminal 100 and the low noise amplifier circuit 21. Specifically, the input end of the reception filter circuit 61R is connected to the antenna connection terminal 100 via the impedance matching circuit 43 and the switch circuit 53. In contrast, the output end of the reception filter circuit 61R is connected to the low noise amplifier circuit 21 via the switch circuit 54 and the impedance matching circuit 42.

The duplexer circuit 62 is capable of passing the radio-frequency signal in the band B. The duplexer circuit 62 transmits the transmission signal and the reception signal in the band B using the FDD method. The duplexer circuit 62 includes the transmission filter circuit 62T and the reception filter circuit 62R.

The transmission filter circuit 62T (B-Tx) has a passband including an uplink operating band of the band B. Accordingly, the transmission filter circuit 62T is capable of passing the transmission signal in the band B. The transmission filter circuit 62T is connected between the power amplifier circuit 11 and the antenna connection terminal 100. Specifically, the input end of the transmission filter circuit 62T is connected to the output end of the power amplifier circuit 11 via the switch circuit 51 and the impedance matching circuit 41. In contrast, the output end of the transmission filter circuit 62T is connected to the antenna connection terminal 100 via the impedance matching circuit 44 and the switch circuit 53.

The reception filter circuit 62R (B-Rx) has a passband including a downlink operating band of the band B. Accordingly, the reception filter circuit 62R is capable of passing the reception signal in the band B. The reception filter circuit 62R is connected between the antenna connection terminal 100 and the low noise amplifier circuit 21. Specifically, the input end of the reception filter circuit 62R is connected to the antenna connection terminal 100 via the impedance matching circuit 44 and the switch circuit 53. In contrast, the output end of the reception filter circuit 62R is connected to the low noise amplifier circuit 21 via the switch circuit 54 and the impedance matching circuit 42.

The control circuit 80 is a power amplifier controller that controls the power amplifier circuit 11. The control circuit 80 receives the control signal from the RFIC 3 via the control terminal 130 and supplies the control signal to the power amplifier circuit 11.

One or more circuits, among the circuits illustrated in FIG. 1, are not necessarily included in the radio-frequency module 1. For example, the radio-frequency module 1 does not necessarily include the circuits for reception as long as the radio-frequency module 1 includes the circuits for transmission. Specifically, the radio-frequency module 1 does not necessarily include the low noise amplifier circuit 21, the impedance matching circuit 42, the switch circuits 54 and 55, and the reception filter circuits 61R and 62R.

[1.2 Arrangement of Components in Radio-Frequency Module 1]

Figure 2:
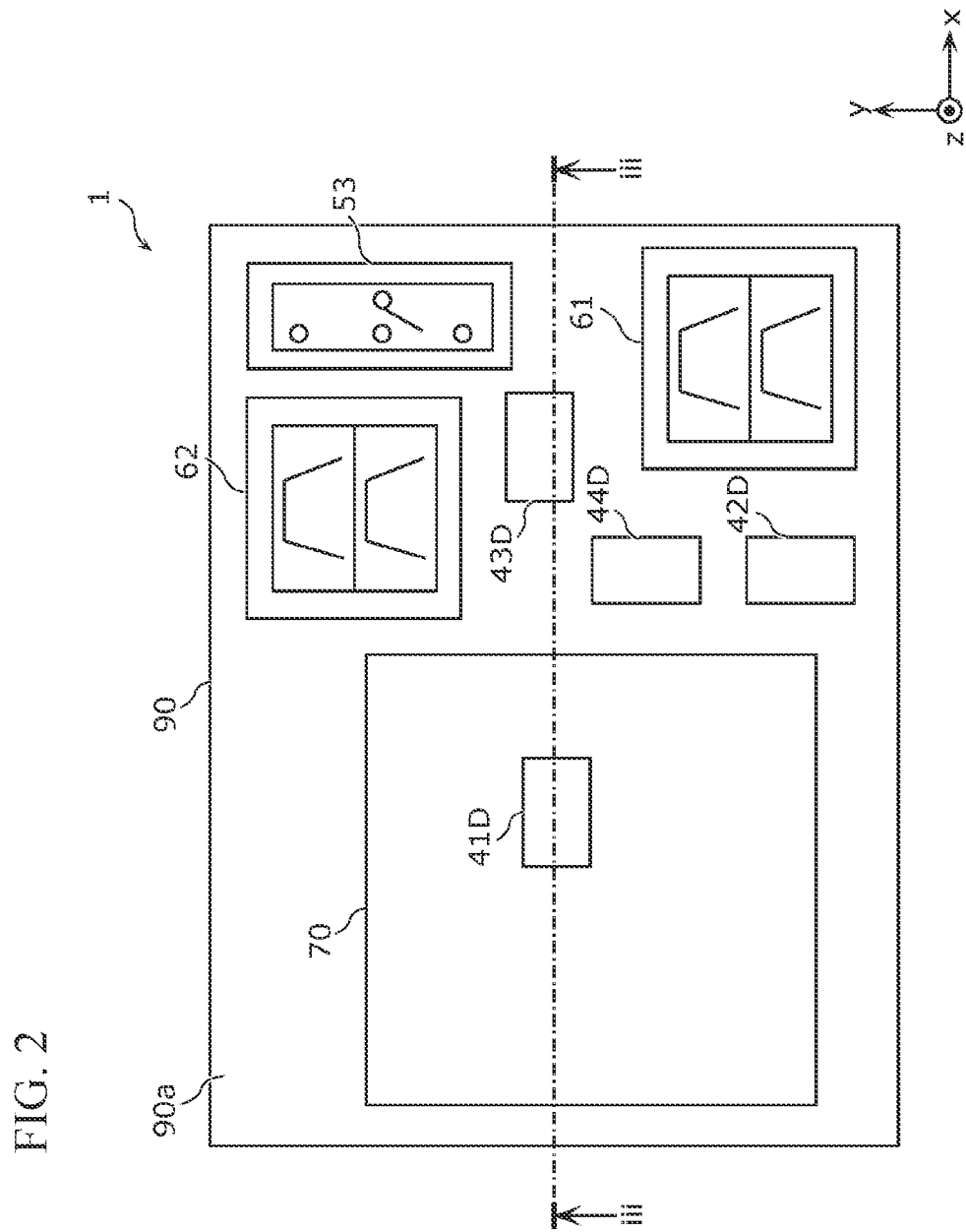
FIG. 2 is a plan view of the radio-frequency module according to the first embodiment.
Figure 3:
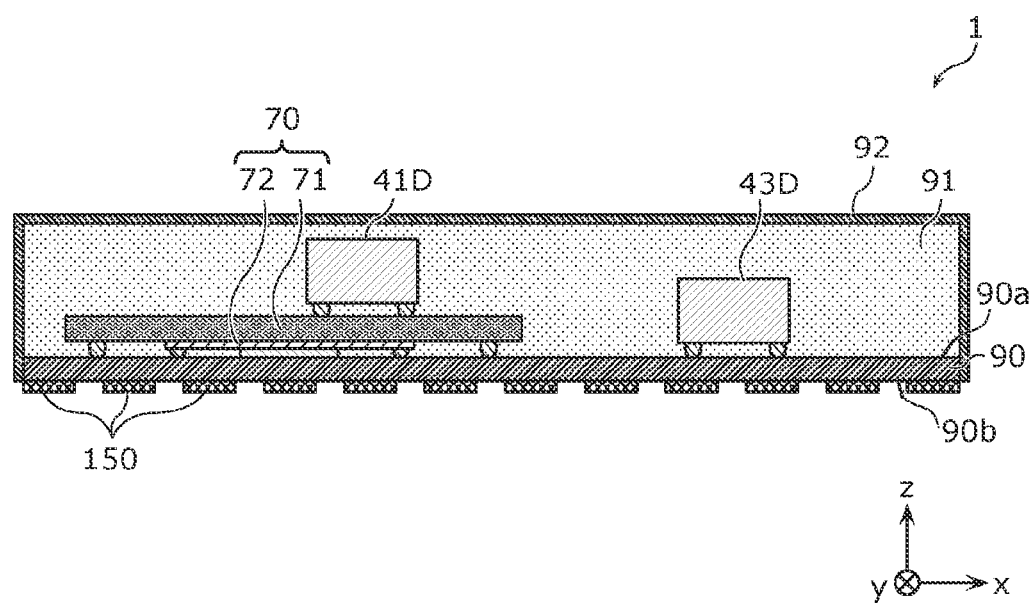
FIG. 3 is a cross-sectional view of the radio-frequency module according to the first embodiment.

Next, an example of the arrangement of the components in the radio-frequency module 1 having the above configuration will be specifically described with reference to FIG. 2 and FIG. 3. FIG. 2 is a plan view of the radio-frequency module 1 according to the first embodiment. FIG. 3 is a cross-sectional view of the radio-frequency module 1 according to the first embodiment. The cross section of the radio-frequency module 1 in FIG. 3 is a cross section along the iii-iii line in FIG. 2.

The radio-frequency module 1 further includes a module substrate 90, a resin member 91, a shield electrode layer 92, and multiple external connection terminals 150, in addition to the components composing the circuits illustrated in FIG. 1. Illustration of the resin member 91 and the shield electrode layer 92 is omitted in FIG. 2. In addition, illustration of lines with which the multiple components arranged on the module substrate 90 are connected is omitted in FIG. 2 and FIG. 3.

The module substrate 90 has main surfaces 90a and 90b that are opposed to each other. Although the module substrate 90 has a rectangular shape in a plan view in the present embodiment, the shape of the module substrate 90 is not limited to this. Although, for example, a low temperature co-fired ceramics (LTCC) substrate having a laminated structure of multiple dielectric layers, a high temperature co-fired ceramics (HTCC) substrate, a component built-in substrate, a substrate including a redistribution layer (RDL), or a printed circuit board may be used as the module substrate 90, the module substrate 90 is not limited to these substrates.

An integrated circuit 70, matching components 41D to 44D, the switch circuit 53, and the duplexer circuits 61 and 62 are arranged on the main surface 90a. The main surface 90a and the components on the main surface 90a are covered with the resin member 91.

The integrated circuit 70 includes a first base 71 and a second base 72. The second base 72 and the first base 71 are laminated on the main surface 90a of the module substrate 90 in this order. The integrated circuit 70 will be described in detail below with reference to FIG. 4 and FIG. 5.

The matching elements included in the impedance matching circuits 41 to 44 are formed in the matching components 41D to 44D, respectively. For example, surface mount devices (SMDs) are used as the matching components 41D to 44D. Some or all of the matching components 41D to 44D may be composed of one integrated passive device (IPD).

The matching component 41D is an example of a first matching component. The matching component 41D is arranged outside the first base 71 and the second base 72. The matching component 41D is arranged on the first base 71 here.

The switch circuit 53 is composed of, for example, multiple metal-oxide-semiconductor field-effect transistors (MOSFETs) that are connected in series to each other. The number of stages of the MOSFET, which are connected in series, may be determined based on required withstanding voltage and is not particularly limited.

Each of the duplexer circuits 61 and 62 may be composed of any of, for example, a surface acoustic wave (SAW) filter, a bulk acoustic wave (BAW) filter, an LC resonant filter, and a dielectric filter and is not limited to these filters.

The main surface 90a and the components on the main surface 90a are covered with the resin member 91. The resin member 91 has a function to ensure the reliabilities, such as the mechanical strength and the moisture resistance, of the components on the main surface 90a. The resin member 91 is not necessarily provided.

The shield electrode layer 92 is a metallic thin film that is formed using, for example, a sputtering method. The shield electrode layer 92 is formed so as to cover the upper surface and the side surfaces of the resin member 91 and the side surfaces of the module substrate 90. The shield electrode layer 92 is set to ground potential to inhibit external noise from entering the components composing the radio-frequency module 1.

The multiple external connection terminals 150 are arranged on the main surface 90b. The multiple external connection terminals 150 include a ground terminal, in addition to the antenna connection terminal 100, the radio-frequency input terminals 111 and 112, the radio-frequency output terminals 121 and 122, and the control terminal 130 illustrated in FIG. 1. Each of the multiple external connection terminals 150 is joined to, for example, an input-output terminal and/or the ground terminal on a mother board arranged in the negative direction of the z axis of the radio-frequency module 1. Although, for example, bump electrodes may be used as the multiple external connection terminals 150, the multiple external connection terminals 150 are not limited to the bump electrodes.

The arrangements of the components illustrated in FIG. 2 and FIG. 3 are only examples and are not limited to the above ones. For example, part or all of the multiple components may be arranged on the main surface 90b of the module substrate 90. In this case, the main surface 90b and the components on the main surface 90b may be covered with a resin member.

[1.3 Configuration of Integrated Circuit 70]

Figure 4:
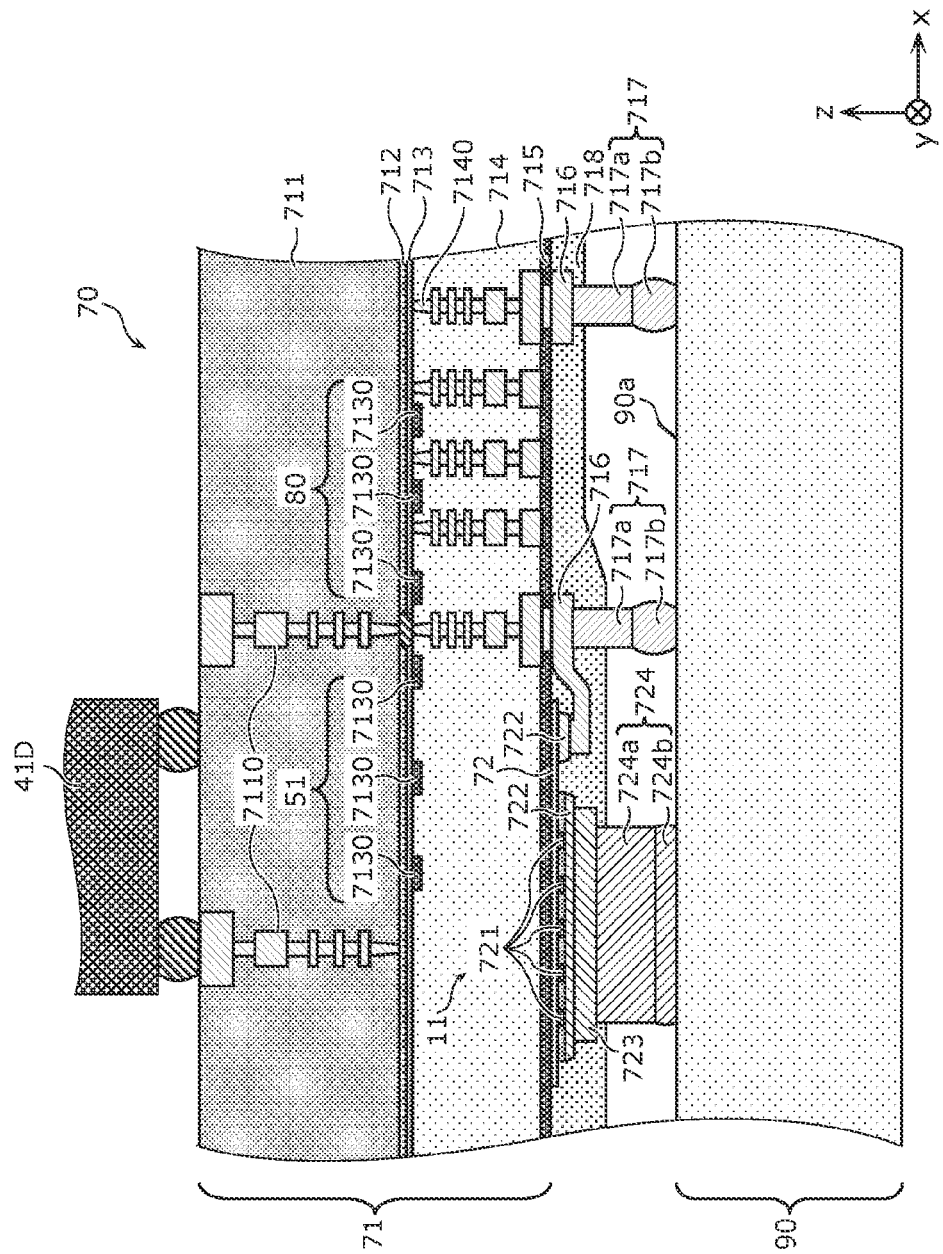
FIG. 4 is a partial cross-sectional view of the radio-frequency module according to the first embodiment.
Figure 5:
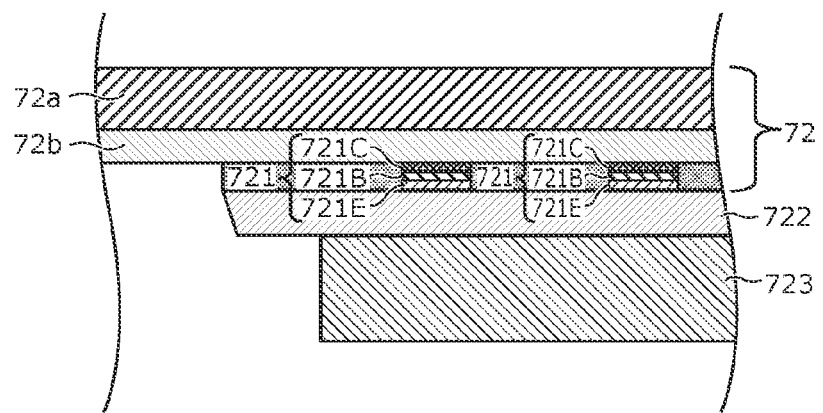
FIG. 5 is a partial cross-sectional view of the radio-frequency module according to the first embodiment.

Next, the configuration of the integrated circuit 70 will be described with reference to FIG. 4 and FIG. 5. FIG. 4 and FIG. 5 are partial cross-sectional views of the radio-frequency module 1 according to the first embodiment. Specifically, FIG. 4 is an enlarged cross-sectional view of the integrated circuit 70 and FIG. 5 is an enlarged cross-sectional view of the second base 72. Illustration of lines and electrodes is omitted in FIG. 4 and FIG. 5 excluding part of them.

As illustrated in FIG. 4, the integrated circuit 70 includes the first base 71 and the second base 72. At least part of the first base 71 is overlapped with at least part of the second base 72 in a plan view. The matching component 41D is arranged on the upper surface of the first base 71.

[1.3.1 Configuration of First Base 71]

The first base 71 will be described here. At least part of the first base 71 is made of a first semiconductor material. Silicon (Si) is used as the first semiconductor material here. The first semiconductor material is not limited to silicon. For example, a material containing any of gallium arsenide (GaAs), aluminium arsenide (AlAs), indium arsenide (InAs), indium phosphide (InP), gallium phosphide (GaP), indium antimonide (InSb), gallium nitride, indium nitride (InN), aluminum nitride (AlN), silicon, germanium (Ge), silicon carbide (SiC), and gallium oxide (III) ($Ga_2O_3$) as the major component or a material containing multicomponent mixed crystal made of multiple materials, among the above materials, as the major component may be used as the first semiconductor material. The first semiconductor material is not limited to the above materials.

The low noise amplifier circuit 21, the switch circuits 51 and 52, and the control circuit 80 are formed in the first base 71. The electrical circuits formed in the first base 71 are not limited to the low noise amplifier circuit 21, the switch circuits 51 and 52, and the control circuit 80. For example, either or some of the low noise amplifier circuit 21, the switch circuits 51 and 52, and the control circuit 80 may be formed in the first base 71. A control circuit (not illustrated) that controls the switch circuits 51 and/or the switch circuit 52 may be formed in the first base 71.

As illustrated in FIG. 4, the first base 71 includes a silicon substrate 711, a silicon dioxide ($SiO_2$) layer 712, a silicon layer 713, a silicon dioxide layer 714, and a silicon nitride (SiN) layer 715. The silicon dioxide layer 712, the silicon layer 713, the silicon dioxide layer 714, and the silicon nitride layer 715 are laminated on the silicon substrate 711 in this order.

The silicon substrate 711 is made of, for example, silicon single crystal and is used as a support substrate. Via electrodes 7110 are formed in the silicon substrate 711. The via electrode 7110 is, for example, a through silicon via (TSV) and is connected to the matching component 41D arranged on the upper surface of the first base 71. The matching component 41D may be connected to a circuit, a component, or a terminal via a conductor different from the via electrode 7110. For example, the matching component 41D may be connected to a circuit, a component, or a terminal via a side-surface line of the integrated circuit 70 and/or a bonding wire.

The silicon dioxide layer 712 is arranged on the silicon substrate 711 and is used as an insulating layer.

The silicon layer 713 is arranged on the silicon dioxide layer 712 and is used as a device layer. In the cross section in FIG. 4, multiple circuit elements 7130 composing the low noise amplifier circuit 21, the switch circuit 51, and the control circuit 80 are formed on the silicon layer 713. As illustrated in FIG. 4, at least part of the switch circuit 51 is overlapped with at least part of the matching component 41D in a plan view.

The silicon dioxide layer 714 is arranged on the silicon layer 713 and is used as a line forming layer. Lines for connecting the control circuit 80 and the switch circuits 51 and 52, which are formed on the silicon layer 713, to electrodes 716 formed on the surface of the silicon nitride layer 715 are formed in the silicon dioxide layer 714. The lines include multiple wiring layers (not illustrated) and multiple via electrodes 7140 with which the multiple wiring layers are connected. The multiple wiring layers and the multiple via electrodes 7140 are made of, for example, copper or aluminium.

The silicon nitride layer 715 is arranged on the silicon dioxide layer 714 and is used as a passivation layer. The electrodes 716, serving as the redistribution layer, are formed on part of the surface of the silicon nitride layer 715. In addition, the second base 72 is joined to another part of the surface of the silicon nitride layer 715.

The electrodes 716 are joined to electrodes (not illustrated) arranged on the module substrate 90 via electrodes 717. The surfaces of the electrodes 716 are insulated with a resin layer 718.

The electrode 717 is an example of a first electrode. The electrode 717 is protruded from the first base 71 toward the main surface 90a of the module substrate 90. The tip of the electrode 717 is joined to the main surface 90a. The electrode 717 includes a columnar conductor 717a and a bump electrode 717b. The bump electrode 717b is joined to an electrode (not illustrated) arranged on the main surface 90a of the module substrate 90.

The configuration of the first base 71 is not limited to the one illustrated in FIG. 4. For example, the first base 71 does not necessarily include one or some of the multiple layers on the silicon substrate 711.

[1.3.2 Configuration of Second Base 72]

Next, the second base 72 will be described. At least part of the second base 72 is made of a second semiconductor material having a thermal conductivity lower than that of the first semiconductor material. Gallium arsenide is used as the second semiconductor material. The second semiconductor material is not limited to gallium arsenide. For example, a material containing any of gallium arsenide, aluminium arsenide, indium arsenide, indium phosphide, gallium phosphide, indium antimonide, gallium nitride, indium nitride, aluminum nitride, silicon-germanium, silicon carbide, gallium oxide (III), and gallium bismuth (GaBi) as the major component or a material containing multicomponent mixed crystal made of multiple materials, among the above materials, as the major component may be used as the second semiconductor material. The second semiconductor material is not limited to the above materials.

The power amplifier circuit 11 is formed in the second base 72. At least part of the power amplifier circuit 11 is overlapped with at least part of the matching component 41D in a plan view, as illustrated in FIG. 4.

Multiple circuit elements 721, electrodes (not illustrated) for applying voltage to the multiple circuit elements 721 or electrodes (not illustrated) for supplying current are formed in the second base 72. The multiple circuit elements 721 are, for example, a hetero-junction bipolar transistor (HBT) including multiple unit transistors that are connected in parallel to each other and composes the power amplifier circuit 11.

As illustrated in FIG. 5, the second base 72 includes a semiconductor layer 72a, an epitaxial layer 72b formed on the surface of the semiconductor layer 72a, and the multiple circuit elements 721. The semiconductor layer 72a is made of the second semiconductor material and is joined to the silicon nitride layer 715 of the first base 71. The semiconductor layer 72a is, for example, a GaAs layer. The circuit element 721 includes a collector layer 721C, a base layer 721B, and an emitter layer 721E. The collector layer 721C, the base layer 721B, and the emitter layer 721E are laminated on the epitaxial layer 72b in this order. In other words, in the circuit element 721, the collector layer 721C, the base layer 721B, and the emitter layer 721E are laminated in this order from the first base 71 side.

As an example, the collector layer 721C is made of n-type gallium arsenide, the base layer 721B is made of p-type gallium arsenide, and the emitter layer 721E is made of n-type indium gallium phosphide (InGaP). The emitter layer 721E is joined to an electrode 723 via an electrode 722 formed on the surface of the second base 72. The electrode 723 is joined to the main surface 90a of the module substrate 90 via an electrode 724.

The electrode 724 is an example of a second electrode. The electrode 724 is protruded from the second base 72 toward the main surface 90a of the module substrate 90. The tip of the electrode 724 is joined to the main surface 90a. The electrode 724 functions as a heat dissipation path for the heat generated in the power amplifier circuit 11. The electrode 724 includes a columnar conductor 724a and a bump electrode 724b. The bump electrode 724b is joined to an electrode (not illustrated) arranged on the main surface 90a of the module substrate 90.

The configuration of the second base 72 is not limited to the one illustrated in FIG. 4 and FIG. 5.

[1.4. Effects and so On]

As described above, the radio-frequency module 1 according to the present embodiment includes the first base 71 at least part of which is made of the first semiconductor material and which includes the electrical circuits (for example, the switch circuits 51 and 52, the control circuit 80, and so on); the second base 72 at least part of which is made of the second semiconductor material having the thermal conductivity lower than that of the first semiconductor material and which includes the power amplifier circuit 11; the matching component 41D that is arranged outside the first base 71 and the second base 72 and that includes the first matching element connected to the power amplifier circuit 11; and the module substrate 90 having the main surface 90a on which the first base 71, the second base 72, and the matching component 41D are arranged. The first matching element includes at least one of an inductor and a capacitor. The first base 71 is joined to the main surface 90a via the electrode 717. The second base 72 is arranged between the module substrate 90 and the first base 71 in a sectional view and is joined to the main surface 90a via the electrode 724. At least part of the first base 71 is overlapped with at least part of the second base 72 in a plan view.

With the above configuration, since the first base 71 including the electrical circuits is overlapped with the second base 72 including the power amplifier circuit 11 in a plan view, it is possible to contribute to the reduction in size of the radio-frequency module 1. In addition, the heat generated in the power amplifier circuit 11 formed in the second base 72 may effectively be discharged to the outside via the first base 71 made of the first semiconductor material having the thermal conductivity higher than that of the second semiconductor material composing the second base 72 and via the electrode 717. Furthermore, since the matching component 41D including the first matching element is arranged outside the first base 71 and the second base 72, it is possible to suppress the degradation of the electrical characteristics of the first matching element, compared with a case in which the first matching element is formed in the first base 71 and the second base 72.

For example, in the radio-frequency module 1 according to the present embodiment, the matching component 41D may be arranged on the first base 71.

With the above configuration, it is possible to further reduce the area in which the components are mounted to contribute to the reduction in size of the radio-frequency module 1.

For example, in the radio-frequency module 1 according to the present embodiment, at least part of the power amplifier circuit 11 may be overlapped with at least part of the matching component 41D in a plan view.

With the above configuration, it is possible to decrease the wiring length between the power amplifier circuit 11 and the matching component 41D to reduce wiring loss and mismatching loss caused by stray capacitance of the wiring.

For example, in the radio-frequency module 1 according to the present embodiment, the electrical circuits may include the switch circuit 51 connected to the output end of the power amplifier circuit 11, the first matching element may be connected to the output end of the power amplifier circuit 11, and at least part of the switch circuit 51 may be overlapped with at least part of the matching component 41D in a plan view.

With the above configuration, it is possible to decrease the wiring length between the switch circuit 51 and the matching component 41D to reduce the wiring loss and the mismatching loss caused by the stray capacitance of the wiring.

For example, in the radio-frequency module 1 according to the present embodiment, the electrical circuits formed in the first base 71 may include the control circuit 80 controlling the power amplifier circuit 11.

With the above configuration, since the control circuit 80 is formed in the first base 71, it is possible to contribute to the reduction in size of the radio-frequency module 1.

For example, in the radio-frequency module 1 according to the present embodiment, the first semiconductor material may be silicon.

With the above configuration, since silicon is used as the first semiconductor material, it is possible to manufacture the first base 71 having a relatively high thermal conductivity at a relatively low cost.

For example, in the radio-frequency module 1 according to the present embodiment, the second semiconductor material may be gallium arsenide.

With the above configuration, since the gallium arsenide is used as the second semiconductor material, it is possible to manufacture the power amplifier circuit 11 of relatively high performance.

For example, in the radio-frequency module 1 according to the present embodiment, the power amplifier circuit 11 may include the circuit element 721 including the collector layer 721C, the base layer 721B, and the emitter layer 721E. The collector layer 721C, the base layer 721B, and the emitter layer 721E may be laminated in this order from the first base 71 side.

With the above configuration, it is possible to simplify the wiring connected to the collector layer 721C, the base layer 721B, and the emitter layer 721E in a manufacturing process. In a plan view, the area of the collector layer 721C is greater than the respective areas of the base layer 721B and the emitter layer 721E. Accordingly, joining the collector layer 721C to the first base 71 enables the joining area to be increased, compared with a case in which the base layer 721B or the emitter layer 721E is joined to the first base 71. As a result, it is possible to enforce the joining between the first base 71 and the second base 72 to suppress peeling-off of the second base 72 from the first base 71.

The radio-frequency module 1 according to the present embodiment includes the first base 71 at least part of which is made of silicon or gallium nitride and which includes the electrical circuits (for example, the switch circuits 51 and 52, the control circuit 80, and so on); the second base 72 at least part of which is made of gallium arsenide or silicon-germanium and which includes the power amplifier circuit 11; the matching component 41D that is arranged outside the first base 71 and the second base 72 and that includes the first matching element connected to the power amplifier circuit 11; and the module substrate 90 having the main surface 90a on which the first base 71, the second base 72, and the matching component 41D are arranged. The first matching element includes at least one of an inductor and a capacitor. The first base 71 is joined to the main surface 90a via the electrode 717. The second base 72 is arranged between the module substrate 90 and the first base 71 in a sectional view and is joined to the main surface 90a via the electrode 724. At least part of the first base 71 is overlapped with at least part of the second base 72 in a plan view.

With the above configuration, since the first base 71 including the electrical circuits is overlapped with the second base 72 including the power amplifier circuit 11 in a plan view, it is possible to contribute to the reduction in size of the radio-frequency module 1. In addition, the heat generated in the power amplifier circuit 11 formed in the second base 72 may effectively be discharged to the outside via the first base 71 made of silicon or gallium nitride having the thermal conductivity higher than that of gallium arsenide or silicon-germanium composing the second base 72 and via the electrode 717. Furthermore, since the matching component 41D including the first matching element is arranged outside the first base 71 and the second base 72, it is possible to suppress the degradation of the electrical characteristics of the first matching element, compared with a case in which the first matching element is formed in the first base 71 and the second base 72.

Second Embodiment

Next, a second embodiment will be described. The present embodiment mainly differs from the first embodiment described above in that a power amplifier circuit includes two power amplifiers and an impedance matching circuit is connected to the output end of each of the two power amplifiers. A radio-frequency module according to the present embodiment will now be described, focusing on points different from the first embodiment described above.

[2.1 Circuit Configuration of Radio-Frequency Module 1A]

A radio-frequency module 1A according to the present embodiment will be described with reference to FIG. 6. FIG.

6 is a diagram illustrating the circuit configurations of the radio-frequency module 1A and a communication apparatus 5A according to the second embodiment. Since the communication apparatus 5A is the same as the communication apparatus 5 according to the first embodiment, a description of the communication apparatus 5A is omitted herein.

Figure 6:
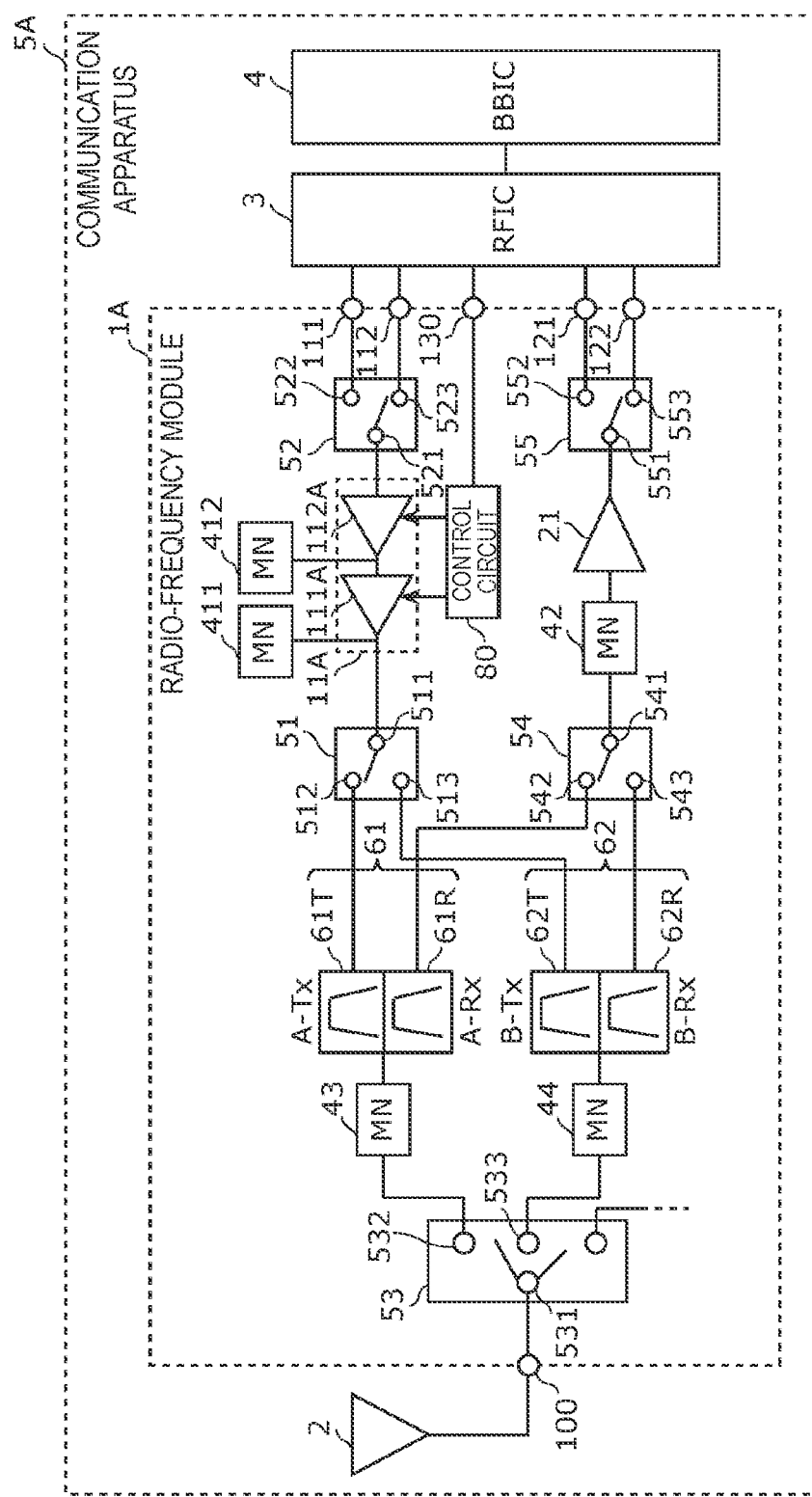
FIG. 6 is a diagram illustrating the circuit configurations of a radio-frequency module and a communication apparatus according to a second embodiment.

As illustrated in FIG. 6, the radio-frequency module 1A includes a power amplifier circuit 11A, the low noise amplifier circuit 21, the impedance matching circuits 42 to 44 and impedance matching circuits 411 and 412, the switch circuits 51 to 55, the duplexer circuits 61 and 62, the control circuit 80, the antenna connection terminal 100, the radio-frequency input terminals 111 and 112, the radio-frequency output terminals 121 and 122, and the control terminal 130.

The power amplifier circuit 11A is a multi-stage amplifier circuit and includes power amplifiers 111A and 112A.

The power amplifier 111A is an example of a first amplifier and corresponds to an output stage of the power amplifier circuit 11A. The power amplifier 111A is connected between the power amplifier 112A and the switch circuit 51. Specifically, an input end of the power amplifier 111A is connected to an output end of the power amplifier 112A and the impedance matching circuit 412. An output end of the power amplifier 111A is connected to the terminal 511 of the switch circuit 51 and the impedance matching circuit 411.

The power amplifier 112A is an example of a second amplifier and is an input stage of the power amplifier circuit 11A. The power amplifier 112A is connected between the switch circuit 52 and the power amplifier 111A. Specifically, an input end of the power amplifier 112A is connected to the terminal 521 of the switch circuit 52. The output end of the power amplifier 112A is connected to the input end of the power amplifier 111A and the impedance matching circuit 412.

The impedance matching circuit 411 is connected to the output end of the power amplifier 111A and includes at least one matching element as an example of the first matching element. The impedance matching circuit 411 is capable of performing the impedance matching between the output impedance of the power amplifier 111A and the input impedance of the switch circuit 51. The impedance matching circuit 411 may be connected to a power supply voltage line of the power amplifier 111A. In this case, the impedance matching circuit 411 may function as a choke inductor or a bypass capacitor.

The impedance matching circuit 412 is connected to the output end of the power amplifier 112A and includes at least one matching element as an example of a second matching element. The impedance matching circuit 412 is capable of performing the impedance matching between the output impedance of the power amplifier 112A and the input impedance of the power amplifier 111A. The impedance matching circuit 412 may be connected to a power supply voltage line of the power amplifier 112A. In this case, the impedance matching circuit 412 may function as a choke inductor or a bypass capacitor.

[2.2 Arrangement of Components in Radio-Frequency Module 1A]

Figure 7:
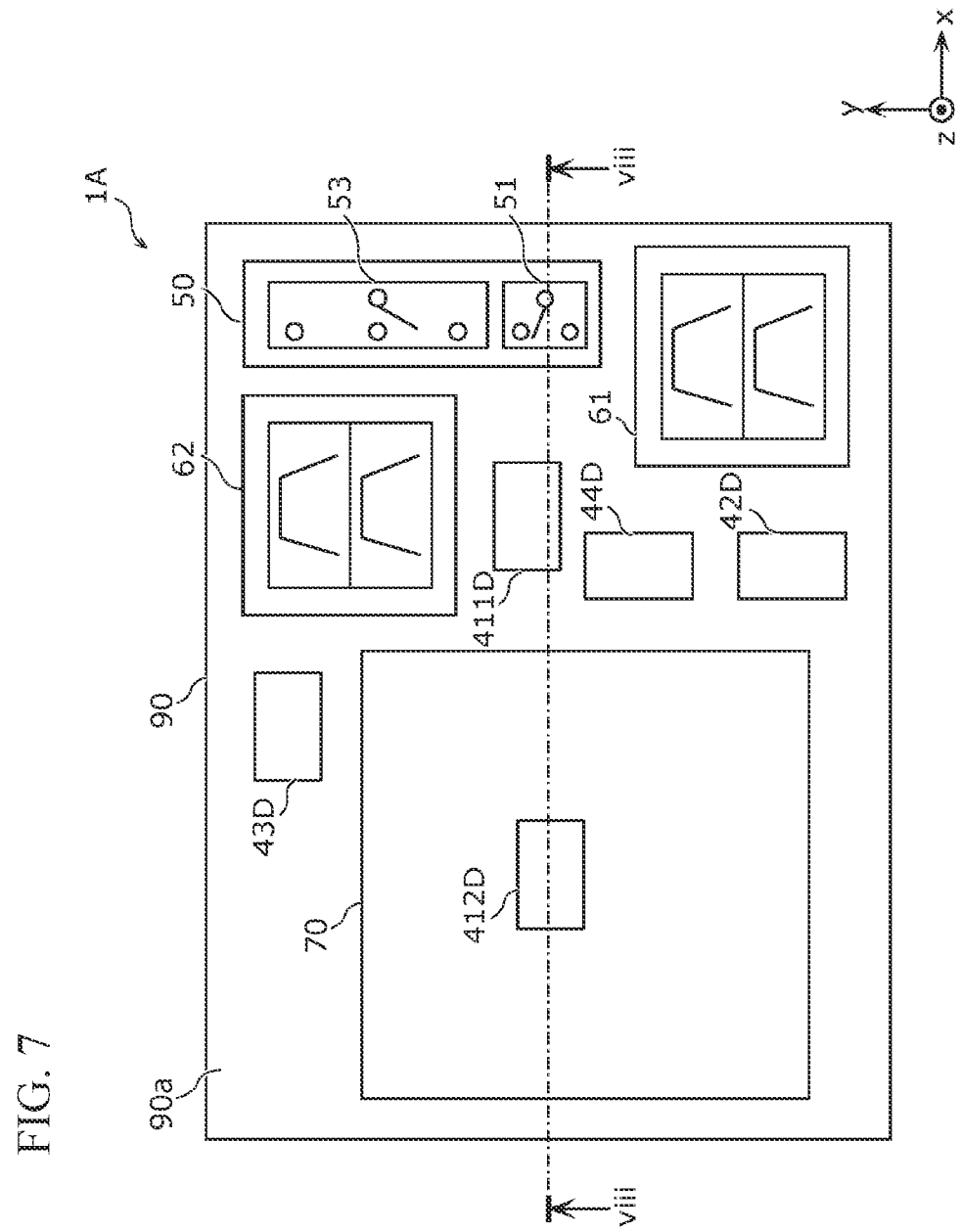
FIG. 7 is a plan view of the radio-frequency module according to the second embodiment.
Figure 8:
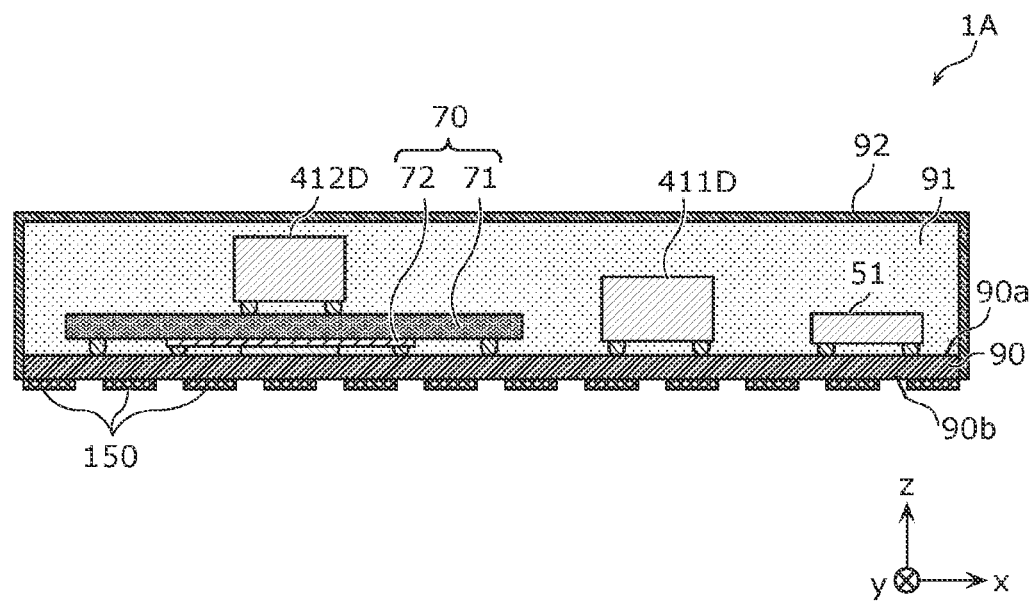
FIG. 8 is a cross-sectional view of the radio-frequency module according to the second embodiment.

Next, an example of the arrangement of the components in the radio-frequency module 1A having the above configuration will be specifically described with reference to FIG. 7 and FIG. 8. FIG. 7 is a plan view of the radio-frequency module 1A according to the second embodiment. FIG. 8 is a cross-sectional view of the radio-frequency module 1A according to the second embodiment. The cross section of the radio-frequency module 1A in FIG. 8 is a cross section along the viii-viii line in FIG. 7.

As in FIG. 2, illustration of the resin member 91 and the shield electrode layer 92 is omitted in FIG. 7. In addition, illustration of lines with which the multiple components arranged on the module substrate 90 are connected is omitted in FIG. 7 and FIG. 8.

The switch circuit 51 is not formed in the first base 71 and is formed in a switch component 50 along with the switch circuit 53. The switch component 50 is composed of, for example, complementary metal oxide semiconductor (CMOS). Specifically, the switch component 50 may be manufactured through a silicon on insulator (SOI) process. Accordingly, it is possible to manufacture the switch component 50 at a low cost. The switch component 50 is not limited to this and may be made of at least one of GaAs, SiGe, and GaN. This enables the high-quality switch circuit 51 to be realized.

The first matching element included in the impedance matching circuit 411 and the second matching element included in the impedance matching circuit 412 are formed in matching components 411D and 412D, respectively.

The matching component 411D is an example of a first matching component and is arranged outside the first base 71 and the second base 72. The matching component 411D is arranged on the main surface 90a of the module substrate 90 here. The matching component 411D is arranged between the power amplifier circuit 11A and the switch circuit 51 in a plan view.

The matching component 412D is an example of a second matching component and is arranged outside the first base 71 and the second base 72. The matching component 412D is arranged on the first base 71 here. At least part of the matching component 412D is overlapped with at least part of the power amplifier circuit 11A in a plan view.

The arrangements of the components illustrated in FIG. 7 and FIG. 8 are only examples and are not limited to the above ones. For example, part or all of the multiple components may be arranged on the main surface 90b of the module substrate 90. In this case, the main surface 90b and the components on the main surface 90b may be covered with a resin member.

[2.3 Effects and so On]

As described above, in the radio-frequency module 1A according to the present embodiment, the power amplifier circuit 11A includes the power amplifiers 111A and 112A. The output end of the power amplifier 112A is connected to the input end of the power amplifier 111A. The first matching element is connected to the output end of the power amplifier 111A. The radio-frequency module 1A includes the matching component 412D that is arranged outside the first base 71 and the second base 72 and that includes the second matching element connected to the output end of the power amplifier 112A. The second matching element includes at least one of an inductor and a capacitor.

With the above configuration, since the matching component 412D including the second matching element is arranged outside the first base 71 and the second base 72, in addition to the matching component 411D including the first matching element, it is possible to suppress the degradation of the electrical characteristics of the first matching element and the second matching element, compared with a case in which the first matching element and the second matching element are formed in the first base 71 and the second base 72.

For example, in the radio-frequency module 1A according to the present embodiment, the matching component 411D may be arranged on the main surface 90a of the module substrate 90.

With the above configuration, it is possible to improve the degree of freedom of the arrangement of the matching component 411D.

For example, the radio-frequency module 1A according to the present embodiment may include the switch component 50 that is arranged on the main surface 90a of the module substrate 90 and that includes the switch circuit 51 connected to the output end of the power amplifier circuit 11A. The first matching element may be connected to the output end of the power amplifier circuit 11A. The matching component 411D may be arranged between the power amplifier circuit 11A and the switch component 50 in a plan view.

With the above configuration, it is possible to decrease the sum of the wiring length between the power amplifier circuit 11A and the matching component 411D and the wiring length between the matching component 411D and the switch component 50 to reduce the wiring loss and the mismatching loss caused by the stray capacitance of the wiring.

For example, in the radio-frequency module 1A according to the present embodiment, the matching component 412D may be arranged on the first base 71.

With the above configuration, it is possible to further reduce the area in which the components are mounted to contribute to the reduction in size of the radio-frequency module 1A.

For example, in the radio-frequency module 1A according to the present embodiment, at least part of the power amplifier circuit 11A may be overlapped with at least part of the matching component 412D in a plan view.

With the above configuration, it is possible to decrease the wiring length between the power amplifier circuit 11A and the matching component 412D to reduce the wiring loss and the mismatching loss caused by the stray capacitance of the wiring.

(First Modification)

Next, a first modification will be described. The present modification mainly differs from the second embodiment described above in the arrangement of the impedance matching circuit 411. The radio-frequency module according to the present modification will now be described with reference to FIG. 9, focusing on points different from the second embodiment described above.

Figure 9:
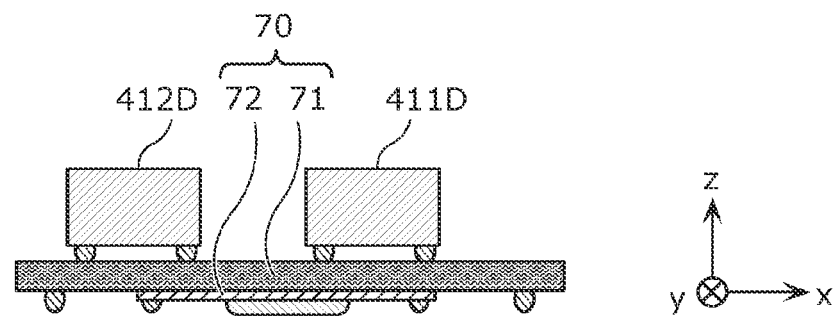
FIG. 9 is a partial cross-sectional view of the radio-frequency module according to a first modification.

FIG. 9 is a partial cross-sectional view of the radio-frequency module 1A according to the first modification. Specifically, FIG. 9 is a cross-sectional view of the integrated circuit 70 and the matching components 411D and 412D.

As illustrated in FIG. 9, the matching component 411D is also arranged on the first base 71, in addition to the matching component 412D, in the present modification. In this case, it is possible to further reduce the area in which the components are mounted to contribute to the reduction in size of the radio-frequency module 1A.

(Second Modification)

Next, a second modification will be described. The present modification mainly differs from the second embodiment described above in the arrangement of the impedance matching circuits 411 and 412. The radio-frequency module according to the present modification will now be described with reference to FIG. 10, focusing on points different from the second embodiment described above.

Figure 10:
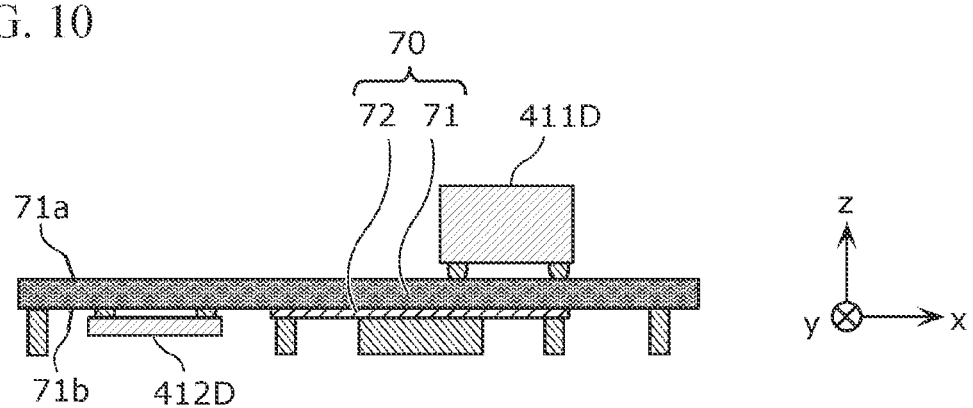
FIG. 10 is a partial cross-sectional view of the radio-frequency module according to a second modification.

FIG. 10 is a partial cross-sectional view of the radio-frequency module 1A according to the second modification. Specifically, FIG. 10 is a cross-sectional view of the integrated circuit 70 and the matching components 411D and 412D.

In the present modification, the matching component 411D is arranged on the first base 71, as in the first modification. More specifically, the matching component 411D is arranged on a first surface 71a of the first base 71.

In contrast, the matching component 412D is arranged on a second surface 71b of the first base 71. The second surface 71b is a surface of the first base 71, which is at the opposite side of the first surface 71a and which is opposed to the main surface 90a of the module substrate 90.

As described above, in the radio-frequency module 1A according to the present modification, the first base 71 has the first surface 71a and the second surface 71b, which is at the opposite side of the first surface 71a and which is opposed to the main surface 90a of the module substrate 90. The matching component 411D is arranged on the first surface 71a and the matching component 412D is arranged on the second surface 71b.

With the above configuration, it is possible to improve the degree of freedom of the arrangement of the matching components 411D and 412D on the first base 71.

The position of the matching component 411D may be replaced with the position of the matching component 412D. Specifically, the matching component 411D may be arranged on the second surface 71b and the matching component 412D may be arranged on the first surface 71a.

In addition, both of the matching components 411D and 412D may be arranged on the second surface 71b. With this configuration, since both of the matching components 411D and 412D are arranged on the second surface 71b of the first base 71, it is possible to trim the top surface of the radio-frequency module 1A to realize low profile.

(Third Modification)

Next, a third modification will be described. The present modification mainly differs from the second embodiment described above in that the impedance matching circuits 411 and 412 are integrated into one component. The radio-frequency module according to the present modification will now be described with reference to FIG. 11, focusing on points different from the second embodiment described above.

Figure 11:
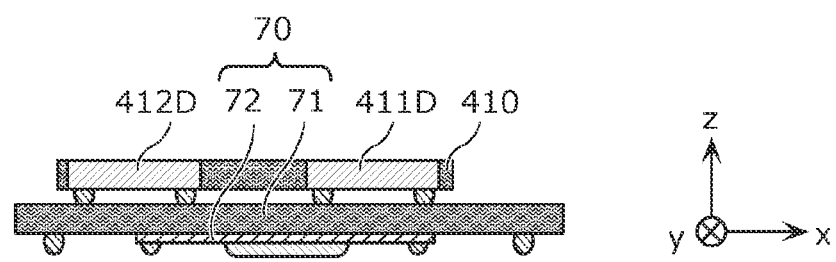
FIG. 11 is a partial cross-sectional view of the radio-frequency module according to a third modification.

FIG. 11 is a partial cross-sectional view of the radio-frequency module 1A according to the third modification. Specifically, FIG. 11 is a cross-sectional view of the integrated circuit 70 and the matching components 411D and 412D.

As illustrated in FIG. 11, the matching components 411D and 412D are included in one IPD 410 arranged on the first base 71 in the present modification.

With this configuration, since the first matching element and the second matching element are capable of being formed in the relatively low-profile IPD 410, it is possible to realize the low profile of the radio-frequency module 1A to contribute to the reduction in size of the radio-frequency module 1A.

Other Embodiments

Although the radio-frequency module and the communication apparatus according to the present disclosure are described above based on the embodiments, the radio-frequency module and the communication apparatus according to the present disclosure are not limited to the above embodiments. Other embodiments realized by combining arbitrary components in the above embodiments, modifications resulting from making various modifications supposed by the person skilled in the art to the above embodiments without departing from the sprit and scope of the present disclosure, various devices incorporating the radio-frequency module and the communication apparatus are also included in the present disclosure.

For example, although the radio-frequency modules are used in the FDD in the respective embodiments described above, the radio-frequency modules are not limitedly used in the FDD. For example, the radio-frequency modules may be used in time division duplex (TDD) or may be used in both the FDD and the TDD. In this case, it is sufficient for the radio-frequency module to include a filter circuit having a passband including a band for the TDD and a switch circuit that switches between transmission and reception.

The position of the impedance matching circuit 411 may be replaced with the position of the impedance matching circuit 412 in the second embodiment and the respective modifications of the second embodiment. For example, in the second embodiment, the impedance matching circuit 411 may be arranged on the first base 71 and the impedance matching circuit 412 may be arranged on the main surface 90a.

The present disclosure is widely applicable to a communication device, such as a mobile phone, as the radio-frequency module arranged in a front-end unit.

1, 1A radio-frequency module
2 antenna
3 RFIC
4 BBIC
5, 5A communication apparatus
11, 11A power amplifier circuit
21 low noise amplifier circuit
41, 42, 43, 44, 411, 412 impedance matching circuit
41D, 42D, 43D, 44D, 411D, 412D matching component
50 switch component
51, 52, 53, 54, 55 switch circuit
61, 62 duplexer circuit
61R, 62R reception filter circuit
61T, 62T transmission filter circuit
70 integrated circuit
71 first base
71a first surface
71b second surface
72 second base
72a semiconductor layer
72b epitaxial layer
80 control circuit
90 module substrate
90a, 90b main surface
91 resin member
92 shield electrode layer
100 antenna connection terminal
111, 112 radio-frequency input terminal
111A, 112A power amplifier
121, 122 radio-frequency output terminal
130 control terminal
150 external connection terminal
410 IPD
711 silicon substrate
712, 714 silicon dioxide layer
713 silicon layer
715 silicon nitride layer
716, 717, 722, 723, 724 electrode
717a, 724a columnar conductor
717b, 724b bump electrode
718 resin layer
721, 7130 circuit element
721B base layer
721C collector layer
721E emitter layer
7110, 7140 via electrode

The invention claimed is:

1. A radio-frequency module comprising:
a first base including electrical circuits, wherein at least a part of the first base is made of a first semiconductor material having a first thermal conductivity;
a second base including a power amplifier circuit, wherein at least a part of the second base is made of a second semiconductor material having a second thermal conductivity lower than the first thermal conductivity;
a first matching component arranged outside the first base and the second base and including a first matching element connected to the power amplifier circuit; and
a module substrate having a main surface, wherein the first base, the second base, and the first matching component are arranged on the main surface,
wherein the first matching element includes at least one of an inductor and a capacitor,
wherein the first base is joined to the main surface via a first electrode,
wherein the second base is arranged between the module substrate and the first base in a sectional view and is joined to the main surface via a second electrode, and
wherein at least the part of the first base is overlapped with at least the part of the second base in a plan view.

2. The radio-frequency module according to claim 1, wherein the first matching component is arranged on the first base.

3. The radio-frequency module according to claim 2, wherein the first base has a first surface and a second surface, the second surface being at the opposite side of the first surface and being opposed to the main surface of the module substrate, and
wherein the first matching component is arranged on the first surface.

4. The radio-frequency module according to claim 3, wherein at least a part of the power amplifier circuit is overlapped with at least a part of the first matching component in a plan view.

5. The radio-frequency module according to claim 3, wherein the electrical circuits include a switch circuit connected to an output end of the power amplifier circuit,
wherein the first matching element is connected to the output end of the power amplifier circuit, and
wherein at least a part of the switch circuit is overlapped with at least a part of the first matching component in a plan view.

6. The radio-frequency module according to claim 2, wherein the first base has a first surface and a second surface, the second surface being at the opposite side of the first surface and being opposed to the second base, and
wherein the first matching component is arranged on the second surface.

7. The radio-frequency module according to claim 1, wherein the first matching component is arranged on the main surface of the module substrate.

8. The radio-frequency module according to claim 6, further comprising:
a switch component arranged on the main surface of the module substrate and including a switch circuit connected to an output end of the power amplifier circuit, wherein the first matching element is connected to the output end of the power amplifier circuit, and wherein the first matching component is arranged between the power amplifier circuit and the switch component in a plan view.

9. The radio-frequency module according to claim 1,
wherein the power amplifier circuit includes a first amplifier and a second amplifier,
wherein an output end of the second amplifier is connected to an input end of the first amplifier, and
wherein the first matching element is connected to an output end of the first amplifier, the radio-frequency module further comprising:
a second matching component arranged outside the first base and the second base and including a second matching element connected to the output end of the second amplifier,
wherein the second matching element includes at least one of an inductor and a capacitor.

10. The radio-frequency module according to claim 9,
wherein the second matching component is arranged on the first base.

11. The radio-frequency module according to claim 10,
wherein the first base has a first surface and a second surface, the second surface being at the opposite side of the first surface and being opposed to the second base, and
wherein the second matching component is arranged on the first surface.

12. The radio-frequency module according to claim 11,
wherein at least a part of the power amplifier circuit is overlapped with at least a part of the second matching component in a plan view.

13. The radio-frequency module according to claim 10,
wherein the first base has a first surface and a second surface, the second surface being at the opposite side of the first surface and being opposed to the second base, and
wherein the second matching component is arranged on the second surface.

14. The radio-frequency module according to claim 9,
wherein the second matching component is arranged on the main surface of the module substrate.

15. The radio-frequency module according to claim 9,
wherein the first matching component and the second matching component are included in one integrated passive device.

16. The radio-frequency module according to claim 1,
wherein the electrical circuits include a control circuit configured to control the power amplifier circuit.

17. The radio-frequency module according to claim 1,
wherein the first semiconductor material is silicon.

18. The radio-frequency module according to claim 1,
wherein the second semiconductor material is gallium arsenide.

19. The radio-frequency module according to claim 1,
wherein the power amplifier circuit includes a circuit element including a collector layer, a base layer, and an emitter layer, and
wherein the collector layer, the base layer, and the emitter layer are laminated in this order from a side of the first base.

20. A radio-frequency module comprising:
a first base including electrical circuits, wherein at least a part of the first base is made of silicon or gallium nitride;
a second base including a power amplifier circuit, wherein at least a part of the second base is made of gallium arsenide or silicon-germanium;
a first matching component arranged outside the first base and the second base and including at least one of an inductor and a capacitor connected to the power amplifier circuit; and
a module substrate having a main surface, wherein the first base, the second base, and the first matching component are arranged on the main surface,
wherein the first base is joined to the main surface via a first electrode,
wherein the second base is arranged between the module substrate and the first base in a sectional view and is joined to the main surface via a second electrode, and
wherein at least the part of the first base is overlapped with at least the part of the second base in a plan view.

* * * * *